(12) United States Patent
Yu et al.

(10) Patent No.: US 7,780,431 B2
(45) Date of Patent: Aug. 24, 2010

(54) NANOIMPRINT MOLDS AND METHODS OF FORMING THE SAME

(75) Inventors: Zhaoning Yu, Palo Alto, CA (US); Wei Wu, Palo Alto, CA (US); Carl E. Picciotto, Palo Alto, CA (US); Jun Gao, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 340 days.

(21) Appl. No.: 11/521,235

(22) Filed: Sep. 14, 2006

(65) Prior Publication Data

US 2008/0067721 A1 Mar. 20, 2008

(51) Int. Cl.
*B29C 33/00* (2006.01)

(52) U.S. Cl. .................. 425/385; 977/887; 264/219; 264/129

(58) Field of Classification Search .................. 425/385; 106/38.2; 977/887; 249/114.1, 115, 112; 264/219, 129; 427/133; 428/411.1
See application file for complete search history.

(56) References Cited

U.S. PATENT DOCUMENTS

| | | | |
|---|---|---|---|
| 5,294,465 A * | 3/1994 | Gallagher | 427/523 |
| 6,309,580 B1 * | 10/2001 | Chou | 264/338 |
| 6,518,189 B1 * | 2/2003 | Chou | 438/706 |
| 6,680,214 B1 * | 1/2004 | Tavkhelidze et al. | 438/20 |
| 6,696,220 B2 | 2/2004 | Bailey et al. | |
| 6,743,368 B2 | 6/2004 | Lee | |
| 6,842,229 B2 | 1/2005 | Sreenivasan et al. | |
| 6,860,956 B2 * | 3/2005 | Bao et al. | 156/232 |
| 6,908,861 B2 * | 6/2005 | Sreenivasan et al. | 438/694 |
| 6,916,585 B2 | 7/2005 | Sreenivasan et al. | |
| 6,955,767 B2 | 10/2005 | Chen | |
| 7,520,742 B2 * | 4/2009 | Motowaki et al. | 425/385 |
| 7,592,255 B2 * | 9/2009 | Kuekes et al. | 438/679 |
| 2002/0071887 A1 | 6/2002 | Seno et al. | |
| 2003/0042043 A1 * | 3/2003 | Clevenger et al. | 174/255 |
| 2005/0202350 A1 * | 9/2005 | Colburn et al. | 430/320 |
| 2007/0018345 A1 * | 1/2007 | Chao et al. | 264/1.1 |
| 2007/0128549 A1 * | 6/2007 | Park et al. | 430/296 |
| 2007/0297091 A1 * | 12/2007 | Choi et al. | 360/131 |
| 2008/0018875 A1 * | 1/2008 | Schram et al. | 355/67 |
| 2008/0028360 A1 * | 1/2008 | Picciotto et al. | 716/21 |
| 2008/0067721 A1 * | 3/2008 | Yu et al. | 264/349 |
| 2008/0138460 A1 * | 6/2008 | Heidari et al. | 425/436 R |
| 2008/0145525 A1 * | 6/2008 | Guo et al. | 427/133 |
| 2009/0285926 A1 * | 11/2009 | Jeng et al. | 425/423 |

* cited by examiner

*Primary Examiner*—Savitri Mulpuri (57) ABSTRACT

A nanoimprint mold includes a substrate having at least one substantially non-transferable feature and at least one transferable feature defined at different portions thereon. Methods for forming the same are also disclosed.

18 Claims, 4 Drawing Sheets

NANOIMPRINT MOLDS AND METHODS OF FORMING THE SAME

BACKGROUND

The present disclosure relates generally to molds, and more particularly to nanoimprint molds and methods of forming the same.

Nano-imprint lithography was initiated as a process to achieve nanoscale features (about 100 nm or smaller) with high throughput and relatively low cost in structures such as, for example, molecular electronic devices. During the imprinting process, the nanoscale features are transferred from a mold to a polymer layer. The mold may be used for a thermal imprint process, as well as for a UV-based imprint process.

In the thermal imprint process, to deform the shape of the polymer, the temperature of the film and mold is generally higher than the glass transition temperature of the polymer, so that the polymer flows more easily to conform to the shape of the mold. Hydrostatic pressure may be used to press the mold into the polymer film, thus forming a replica of the mold in the polymer layer. The press is then cooled below the glass transition temperature to "freeze" the polymer and form a more rigid copy of the features in the mold. The mold is then removed from the substrate.

In the alternate UV imprint process, a UV-curable monomer solution is used instead of a thermoplastic polymer. The monomer layer is formed between the mold and the substrate. When exposed to a UV light, the monomer layer is polymerized to form a film with the desired patterns thereon. The UV-based nanoimprint process may generate patterns at room temperature with low pressure.

Precise alignment of the features to be transferred during nanoimprinting processes may be difficult to achieve. This may be due, at least in part, to the small feature sizes (e.g., smaller than visible wavelengths), and differences in the thermal expansion coefficients of the mold and the substrate to be molded. An optical microscope generally cannot resolve such small features. Alignment accuracy is generally on the same order as the feature size; as such, alignment accuracy may be difficult to achieve.

BRIEF DESCRIPTION OF THE DRAWINGS

Features and advantages of embodiments of the present disclosure will become apparent by reference to the following detailed description and drawings, in which like reference numerals correspond to similar, though not necessarily identical components. For the sake of brevity, reference numerals or features having a previously described function may not necessarily be described in connection with other drawings in which they appear.

DETAILED DESCRIPTION

Embodiments of the nanoimprint mold disclosed herein have blind, substantially non-transferable features that advantageously act as alignment members when using the mold for imprinting processes. As referred to herein, the phrases "blind, substantially non-transferable feature," "non-transferable feature," and the like are defined as a form that imprints a much shallower, if any, impression in a moldable material than an impression imprinted by a transferable feature. It is to be understood that the blind, substantially non-transferable feature does not substantially imprint the moldable material, or it imprints the moldable material so slightly (when compared to a transferable feature) that substantially no appreciable difference in the surface of the moldable material is made when compared to the imprint formed from the transferable feature(s). The shallow impression formed by the substantially non-transferable feature may be used to align other non-transferable features of molds used in subsequent imprinting processes. Additionally, the shallow impression of the substantially non-transferable feature may be easily removable from the surface of the moldable material if desired.

Furthermore, embodiments of the method for forming the molds advantageously establish the patterns for the transferable and non-transferable features substantially simultaneously. This simultaneous pattern formation substantially eliminates alignment error generally present when forming mold feature patterns via multiple lithography processes. The pattern positions (i.e., transferable feature position relative to non-transferable feature position) for each of the molds formed using an embodiment of the method disclosed herein will be the same.

Figure 1:
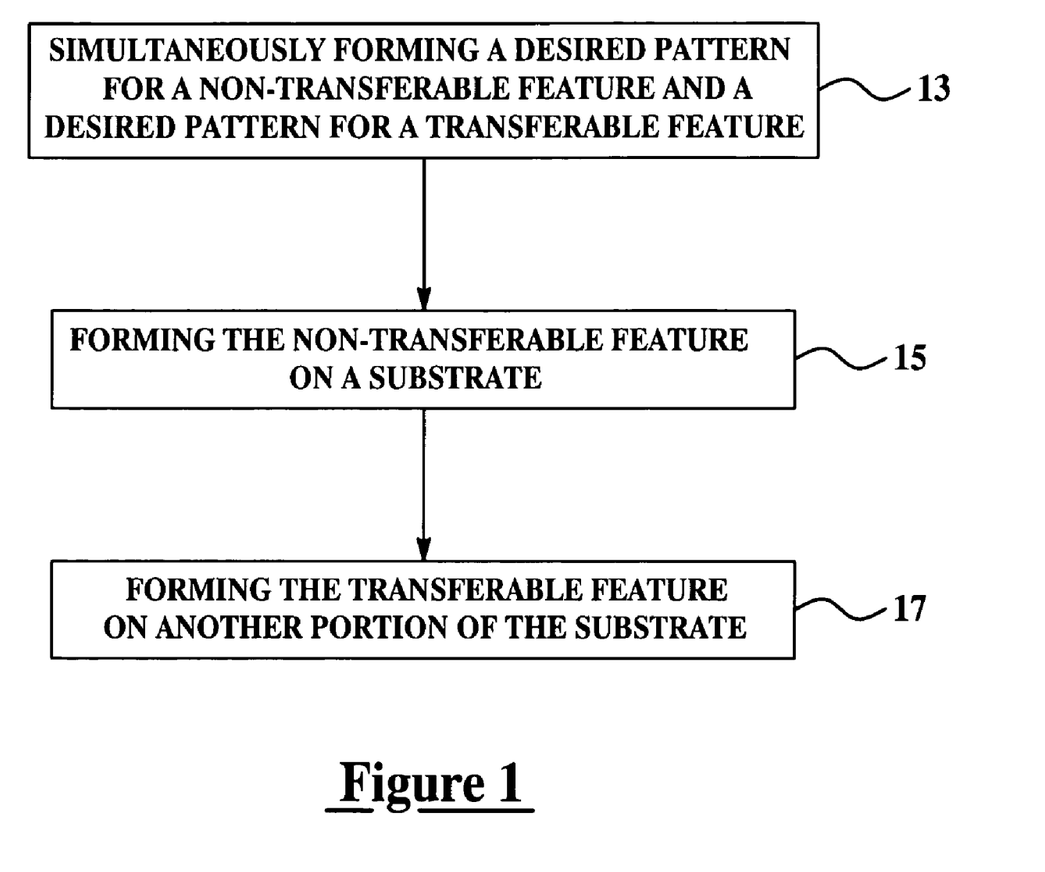
FIG. 1 is a flow diagram depicting an embodiment of the method for forming a nanoimprint mold.

Referring now to FIG. 1, a general embodiment of the method for forming the nanoimprint mold is depicted. The method includes simultaneously forming a desired pattern for at least one substantially non-transferable feature and a desired pattern for at least one transferable feature, as depicted at reference numeral 13. The method further includes forming the substantially non-transferable feature on a portion of a substrate, as depicted at reference numeral 15; and forming the transferable feature on an other portion of the substrate, as shown at reference numeral 17.

Figure 2A:
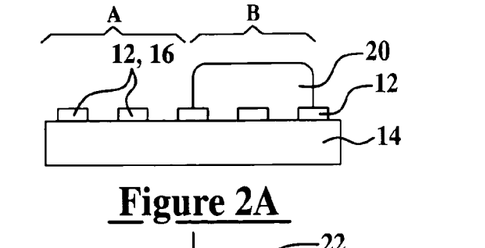
FIGS. 2A through 2F depict a schematic flow diagram of an embodiment of the method for forming a nanoimprint mold.
Figures 2B, 2C, 2D, 2E, 2F, 3B, 3C, 3D, 3E:
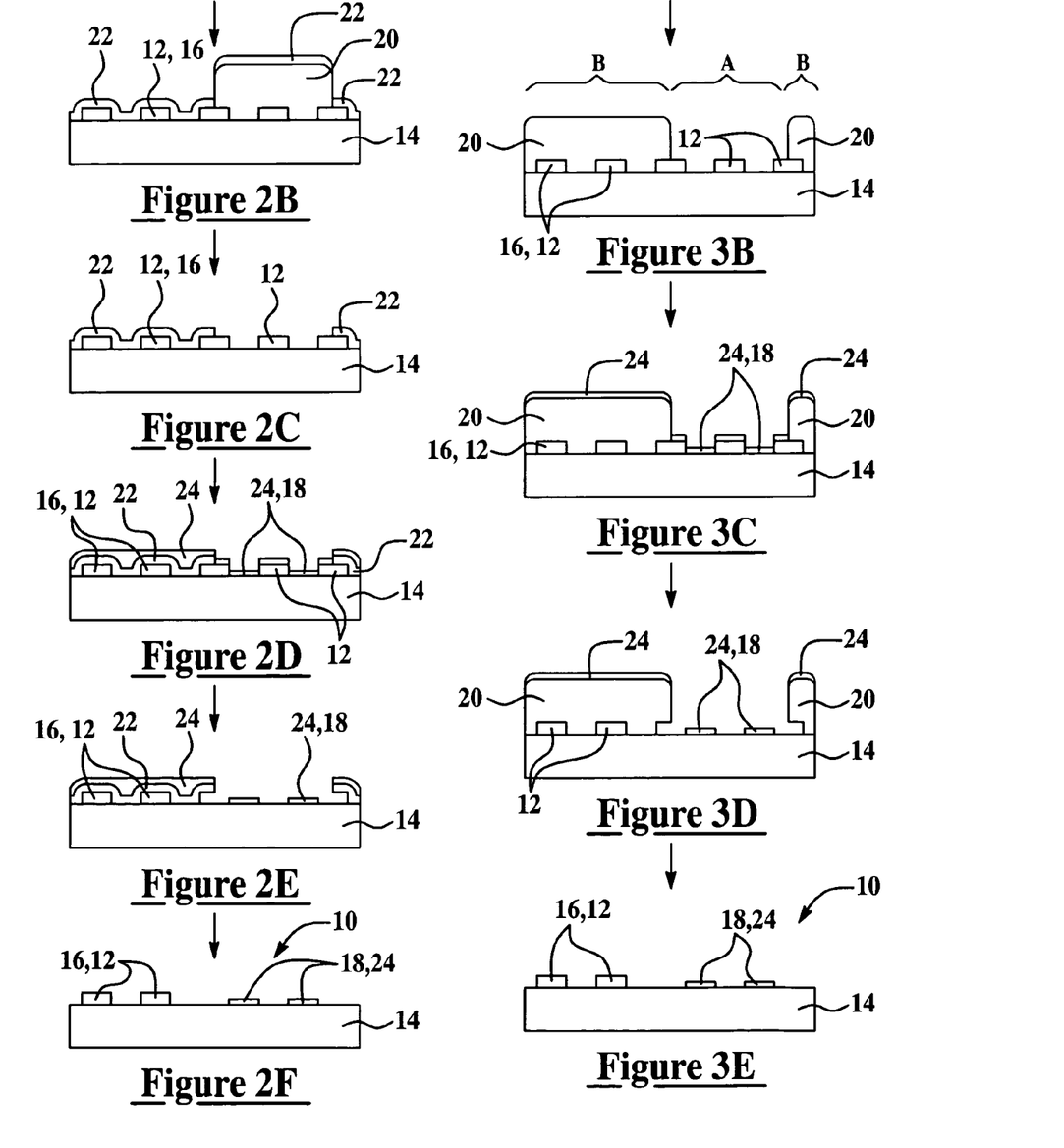
FIGS. 3A through 3E depict a schematic flow diagram of another embodiment of the method for forming a nanoimprint mold.

FIGS. 2A through 2F depict an embodiment of the method for forming the nanoimprint mold 10 (shown in FIG. 2F). As shown in FIG. 2A, the method includes establishing a material 12 on at least two different portions of a substrate 14. Examples of the material 12 include, but are not limited to silicon, silicon dioxide, silicon nitride, α-silicon, silicon carbide, metals (e.g., nickel, aluminum, titanium, or the like), diamond, $CaF_2$, or combinations thereof. The material 12 may be established via any suitable process, including electron beam lithography, reactive ion etching, nanoimprint lithography, x-ray lithography (e.g., EUV-photolithography), photolithography, ion milling, liftoff, focused ion beam (FIB), and/or combinations thereof.

The material 12 is established so that a desirable pattern for the position of the ultimately formed features 16, 18 is formed. The single step of establishing the material 12 simultaneously forms the two patterns. In this embodiment, the patterns include desirable transferable feature(s) 16 and desirable spaces that are ultimately used for forming the non-transferable feature(s) 18 (shown in FIGS. 2D-2F). The material 12 may be established so that desirable feature patterns (e.g., width, alignment of features, etc.) are formed.

It is to be understood that at least one of these material 12 portions is the transferable feature 16 (see FIG. 2F). As such, the material 12 may be established in any shape, geometry, or configuration that is desirable for the transferable feature 16. It is to be understood that the material 12 is established having a predetermined thickness so that the transferable feature 16 has a height that is larger than a height of a subsequently formed substantially non-transferable feature 18 (shown in FIGS. 2D-2F). The height of the transferable feature 16 depends, at least in part, on the desirable height of the object to be formed using the mold 10, and generally ranges from about 20 nm to about 1000 nm.

It is to be understood that any suitable substrate 14 may be used. Non-limitative examples of substrate 14 materials include glass, quartz, silicon, fused silica, silicon carbide, or combinations thereof.

FIG. 2A also depicts a sacrificial layer 20 established so that at least one portion of the material 12 and some portions of the substrate 14 adjacent thereto remain exposed (labeled A), and so that another portion of the material 12 and some portions of the substrate 14 adjacent thereto are covered (labeled B). In this embodiment, the sacrificial layer 20 completely covers some of the material 12, partially covers some other of the material 12, and does not contact still some other of the material 12.

In an embodiment, the sacrificial layer 20 is established using photolithography, electron beam (e-beam) lithography, combinations thereof, or other like techniques. Any suitable sacrificial layer 20 may be used, non-limiting examples of which include photoresists, polymers, or combinations thereof. In a non-limitative example embodiment, the sacrificial layer 20 is polymethylmethacrylate (PMMA), and e-beam lithography is used to pattern it.

Referring now to FIG. 2B, a first layer 22 is established on the sacrificial layer 20, the exposed material 12, and any exposed portions of the substrate 14. The first layer 22 may be established via any suitable deposition technique. Non-limitative examples of such techniques include sputtering, chemical vapor deposition, atomic layer deposition, evaporation, inkjet deposition, spin-coating, or the like, or combinations thereof. It is to be understood that the first layer 22 may be any suitable material, as long as it may be selectively removed with respect to second layer 24 (described hereinbelow). Non-limiting examples of materials suitable for the first layer 22 include, but are not limited to nickel, aluminum, metal alloys, $CaF_2$, or combinations thereof.

The method further includes removing the sacrificial layer 20 (and the first layer 22 established thereon) to expose the portion of the material 12 and the adjacent portions of the substrate 14 (e.g., the non-transferable feature(s) 18 pattern) that were under the sacrificial layer 20. This is shown in FIG. 2C. Removal of the sacrificial layer 20 (and first layer 22) may be accomplished by exposing the sacrificial layer 20 (and the first layer 22 established thereon) to solvents (e.g., acetone, isopropyl alcohol, photoresist stripper) and ultrasonic agitation.

Referring now to FIG. 2D, a second layer 24 is established on at least the exposed portions of the substrate 14. It is to be understood that the second layer(s) 24 established in this portion(s) is/are the substantially non-transferable feature(s) 18. As such, the second layer 24 has a predetermined height that is smaller than the height of the transferable feature(s) 16. It is to be understood that the height of the substantially non-transferable feature(s) 18 is determined such that the feature 18 substantially does not transfer to an object or material that is being molded. As such, the substantially non-transferable feature(s) 18 may be used to substantially precisely align the mold 10 (as shown in FIG. 2F) with the object/material to be molded. In an embodiment, the thickness of the second layer 24 (i.e., height of substantially non-transferable feature 18) ranges from about 2 nm to about 200 nm.

In the embodiments disclosed herein, it is to be understood that the material 12 and the layers 24, 26 (described further hereinbelow) may be deposited at a first thickness, and then etched and/or planarized to achieve the desirable final thickness (i.e., heights of the transferable and substantially non-transferable features 16, 18). Generally, the initial thickness of the material 12 or layers 24, 26 ranges from about 20 nm to about 1000 nm. Depending on the desirable height of the transferable features 16, the initial thickness of the material 12 may be etched and/or planarized so that the final thickness (i.e., height) ranges from about 20 nm to about 1000 nm. Depending on the desirable height of the substantially non-transferable features 18, the initial thickness of the layers 24, 26 is etched and/or planarized so that the final thickness (i.e., height) is, for example, from about 10% to about 20% of the initial thickness.

A non-limitative example of the second layer 24 (or substantially non-transferable feature(s) 18) is chromium, platinum, tungsten, gold, aluminum, silicon nitride, silicon, or combinations thereof.

As shown in FIG. 2D, the second layer 24 may also be established on areas of the first layer 22 and/or the exposed material 12. Establishing the second layer 24 may be accomplished using any of the deposition techniques described herein, in particular those techniques used to deposit the first layer 22.

Referring now to FIG. 2E, some of the material 12 is removed. In this embodiment, the material 12 that is removed is directly adjacent the second layer 24 that is established on the exposed portions of the substrate 14. As depicted in FIG. 2E, some of the material 12 that is removed is completely exposed, and some other of the material 12 is partially exposed. It is to be understood that during removal of the material 12, any of the second layer 24 that is established on the material 12 is also removed. Removal may be accomplished via selective etching processes. In a non-limitative example, hydrochloric acid may be used to selectively etch material 12, such as, for example, $CaF_2$, nickel, aluminum, titanium, or the like.

The first layer 22 may then be removed to expose the remaining material 12, or the transferable feature(s) 16. It is to be understood that during this removal process, any of the second layer 24 that is established on the first layer 22 may also be removed. It is to be further understood that any removal process suitable for selectively removing the desired areas of the layer(s) 22, 24 may be used.

FIG. 2F depicts an embodiment of the formed nanoimprint mold 10. It is to be understood that when the mold 10 is used, the substantially non-transferable features 18 substantially will not transfer to the object/material being molded. Without being bound to any theory, it is believed that the substantially non-transferable feature(s) 18 has a lower contrast in the material to be molded when compared with the transferable feature(s) 16. In some instances, the difference in contrast between the substantially non-transferable and transferable feature(s) 18, 16 is too small, and the substantially non-transferable feature 18 may be transferred to the moldable material. It is believed that a substantially non-transferable feature 18 having a height that is less than about 20% of the height of the transferable feature 16 substantially avoids undesirable transfer of its pattern to the material to be molded.

Figure 3A:
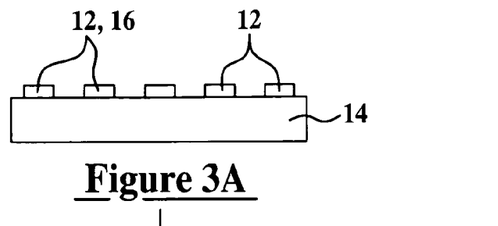

Referring now to FIGS. 3A through 3E, another embodiment of the method for forming the nanoimprint mold 10 (shown in FIG. 3E) is depicted. As shown in FIG. 3A, a material 12 (similar to that previously described) is established on at least two different portions of the substrate 14. The material 12 forms the desired patterns for the features 16, 18. In this embodiment, the patterns include desirable transferable feature(s) 16 and desirable spaces that are ultimately used for forming the non-transferable feature(s) 18 (shown in FIGS. 3C-3E).

In the non-limiting example shown in FIG. 3A, the material 12 is established on five different portions of the substrate 14. It is to be understood that at least one of these portions of the material 12 is a transferable feature 16 (shown in FIG. 3E), and thus has a height suitable for a transferable feature 16, and larger than the height of the subsequently formed substantially non-transferable feature 18.

FIG. 3B depicts the establishment of a sacrificial layer 20. In this embodiment, the sacrificial layer 20 is established so that the material 12 at one of the different portions and some of the substrate 14 adjacent thereto remains exposed (labeled A). The areas labeled B depict the sacrificial layer 20 established on some of the material 12 portions and on some adjacent areas of the substrate 14. It is to be understood that at areas B where the sacrificial layer 20 is established, it may cover substantially the entire material 12 portion or part of the material 12 portion (thereby leaving another part of the material 12 exposed).

FIG. 3C depicts the establishment of a layer 24 (referred to as "second layer" in reference to FIG. 2D) on the exposed portion of the substrate 14. The layer 24 is established (e.g., deposited, or deposited and etched/planarized/patterned) at a predetermined height so that the layer 24 may function as a substantially non-transferable feature 18 (shown in FIG. 3E). It is to be understood that the layer 24 may also be established on the sacrificial layer 20 and the exposed (or partially exposed) portion of material 12.

Referring now to FIGS. 3D and 3E together, the exposed and partially exposed portions of the material 12 (and any of layer 24 established thereon) are removed (FIG. 3D), and then the sacrificial layer 20 (and any of layer 24 established thereon) is removed (FIG. 3E), thereby exposing the transferable and substantially non-transferable features 16, 18. It is to be understood that removal of the material 12, the sacrificial layer 20, and any of layer 24 portions established thereon, may be accomplished via any suitable techniques described herein.

Figure 4A:
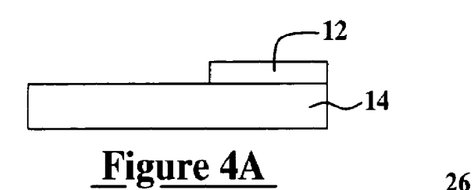
FIGS. 4A through 4C depict a schematic flow diagram of an embodiment of the method for forming another embodiment of the nanoimprint mold.
Figure 4B:
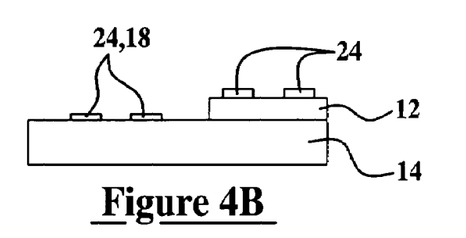
Figure 4C:
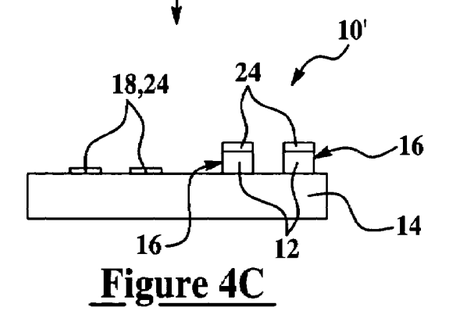

Referring now to FIGS. 4A through 4C, an embodiment for forming another embodiment of the nanoimprint mold 10' is depicted (shown in FIG. 4C). FIG. 4A depicts a material 12 established on a portion of the substrate 14, so that at least one portion of the substrate 14 remains exposed. It is to be understood that any of the previously described substrates 14 and materials 12 may be used in this embodiment. Furthermore, any suitable establishing techniques (e.g., electron beam lithography, reactive ion etching, nanoimprint lithography, photolithography, liftoff, or the like) described herein may be used to establish the material 12 on the substrate 14.

Referring now to FIG. 4B, a layer 24 is established on at least a portion of the material 12, and on at least a portion of the substrate 14. In this embodiment, the layer 24 forms the pattern for the features 16, 18. As depicted, the pattern established on the substrate 14 defines the non-transferable feature (s) 18, and the pattern established on the material 12 defines the shape, size, and/or configuration for the ultimately formed transferable feature(s) 16.

As shown in FIG. 4B, the layer 24 is established (e.g., deposited to a desirable height, or deposited and patterned) on two different areas of the material 12, and on two different areas of the substrate 14. The layer 24 established on the substrate 14 forms the substantially non-transferable feature (s) 18, and thus has a predetermined height suitable for the substantially non-transferable feature(s) 18 (e.g., a height ranging from about 2 nm to about 200 nm). The height/thickness of the layer 24 established on the substrate 14 may be substantially the same or different than the height of the layer 24 that is established on the material 12.

In an embodiment, the layer 24 is deposited via lithography, and then is patterned to have a desirable geometry and/or thickness via lift-off processes or etching processes.

FIG. 4C depicts a portion of the material 12 removed by a selective etch process. After removal, those portions of the material 12 having the layer 24 thereon remain on the substrate 14. These portions form the transferable feature(s) 16. It is to be understood that the height of the transferable feature (s) 16 (including both the material 12 and the layer 24) is larger/higher than the height of the substantially non-transferable feature(s) 18.

Figure 5A:
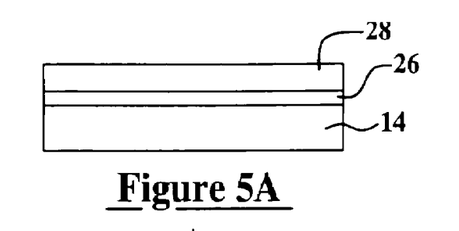
FIGS. 5A through 5E depict a schematic flow diagram of an embodiment of the method for forming still another embodiment of the nanoimprint mold.
Figure 5B:
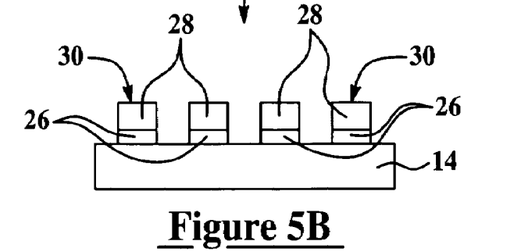
Figure 5C:
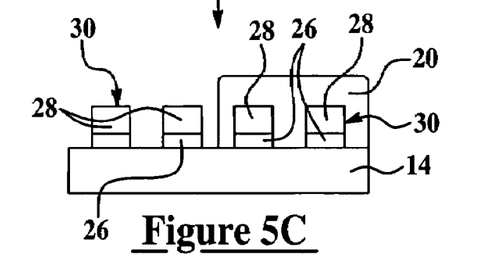
Figure 5D:
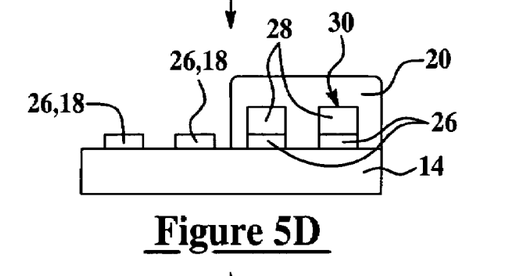
Figure 5E:
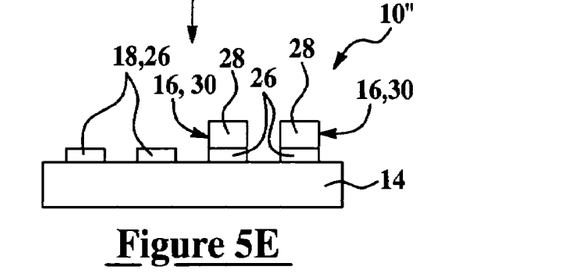

Referring now to FIGS. 5A through 5E, still another embodiment of a method for forming a nanoimprint mold 10" is depicted (shown in FIG. 5E). As shown in FIG. 5A, at least two layers 26, 28 are established on the substrate 14 so that the first layer 26 is established on the substrate 14, and the second layer 28 is established on the first layer 26.

Areas of the first layer 26 ultimately form the substantially non-transferable feature(s) 18, and thus the first layer 26 is established with a thickness (i.e., height) suitable for the substantially non-transferable feature(s) 18. The first layer 26 may be formed of chromium, platinum, tungsten, gold, aluminum, silicon nitride, silicon, or combinations thereof. Any suitable deposition technique may be used to establish the first layer 26, non-limiting examples of which include evaporation, sputtering, plating, or the like, or combinations thereof.

Areas of the second layer 28, in combination with areas of the first layer 26, ultimately form the transferable feature(s) 16. As such, the second layer 28 may be established having any thickness (height) that, together with the thickness of the first layer 26, is suitable for the transferable feature(s) 16. Non-limiting examples of materials suitable for the second layer 28 include silicon, silicon dioxide, silicon nitride, α-silicon, silicon carbide, or combinations thereof.

The method further includes removing at least a portion of the two layers 26, 28 to form the desirable patterns for the features 16, 18. The patterns include at least two stacks 30 (one of which will become the transferable feature 16, and another of which will become the substantially non-transferable feature 18). The stacks 30 are formed by patterning and removing areas of the layers 26, 28 via lithography and etching processes. As shown in FIG. 5B, the layers 26, 28 are patterned to form four different stacks 30. It is to be understood, however, that any desirable number of stacks 30 may be formed.

Referring now to FIG. 5C, a sacrificial layer 20 is established on the stack(s) 30. The stack(s) 30 ultimately become or form the transferable feature(s) 16. In the non-limiting example depicted in FIG. 5C, the sacrificial layer 20 is established on two of the stacks 30. It is to be understood any suitable sacrificial layer material (e.g., the Clariant AZ series, commercially available from Clariant Corporation in Somerville, N.J.; and the Microchem 1800 series, commercially available from MicroChem Corporation in Newton, Mass.) and any suitable technique (e.g., photolithography) for establishing the sacrificial layer 20 may be used.

While the sacrificial layer 20 covers some of the stack(s) 30, the second layer 28 is removed from the other exposed stacks 30, as shown in FIG. 5D. Removal of the second layer 28 leaves the first layer 26 remaining on the substrate 14, which forms the substantially non-transferable feature(s) 18. In an embodiment, the second layer 28 is removed by selective etching processes (e.g., KOH etching or chlorine reactive ion etching). Such processes generally do not appreciably etch the first layer 26.

FIG. 5E depicts the removal of the sacrificial layer 20, which exposes the transferable feature(s) 16. Removal of the sacrificial layer 20 may be accomplished via the removal techniques previously described.

Figure 6A:
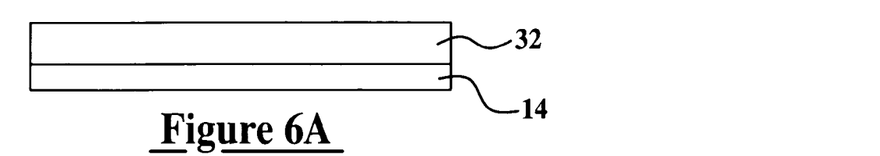
FIGS. 6A through 6F depict a schematic flow diagram of an embodiment of the method for forming yet another embodiment of the nanoimprint mold.

FIGS. 6A through 6F depict still another embodiment of forming a mold 10''' (shown in FIG. 6F) having transferable features 16 and non-transferable features 18. As depicted in FIG. 6A, the substrate 14 has an amorphous silicon layer 32 established thereon. This layer 32 may be established by any suitable technique. Non-limiting examples of such techniques include sputtering, evaporation, chemical vapor deposition (CVD, including low pressure chemical vapor deposition (LPCVD), plasma enhanced chemical vapor deposition (PECVD), and/or the like).

Portions of the amorphous silicon layer 32 ultimately form the transferable feature(s) 16. As such, the height of the layer 32 is established at a height as desired and/or suitable for the transferable feature(s) 16.

Figure 6B:
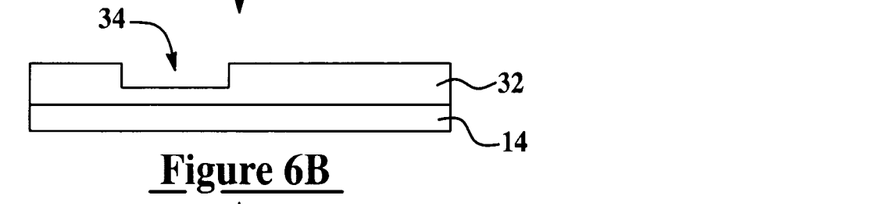

A well 34 is patterned in the amorphous silicon layer 32, as shown in FIG. 6B. The well 34 is established so that at least a portion of the amorphous silicon layer 32 has a height suitable for the transferable feature(s) 16, and another portion has a height suitable for the non-transferable feature(s) 18.

Figure 6C:
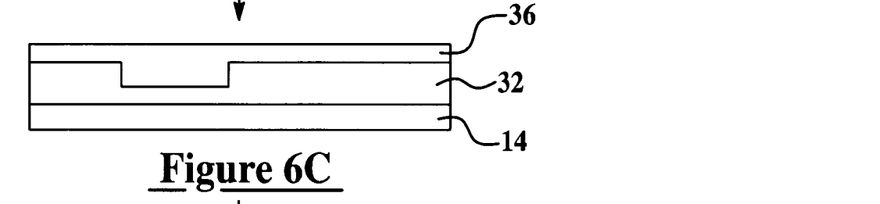

Referring now to FIG. 6C, a spin-on oxide layer 36 is established in the well 34 and on the amorphous silicon layer 32. A non-limiting example of a spin-on oxide layer 36 is hydrogen silsesquioxane (HSQ). The oxide layer 36 is established via a spin-on technique, and then may be etched back to a desirable thickness. Etching may be accomplished by reactive ion etching (RIE), chemical mechanical polishing (CMP), and/or other like methods.

Figure 6D:
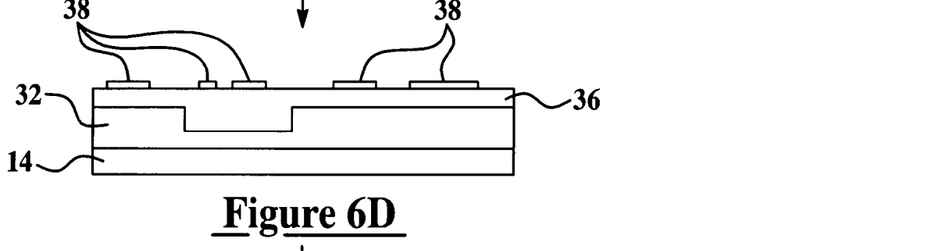

FIG. 6D depicts a patterned mask 38 on the spin-on oxide layer 36. The mask 38 is established to form the desirable patterns for the transferable and non-transferable features 16, 18. In an embodiment, the mask 38 is formed of chromium, nickel, platinum, resist materials, or the like, or combinations thereof. Establishing the mask 38 may be accomplished by nanoimprint lithography, electron beam lithography, photolithography, scanning probe lithography, evaporation and lift-off techniques, or the like, or combinations thereof.

Figure 6E:
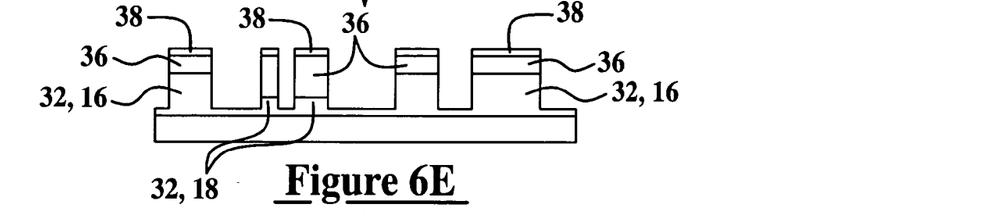

Referring now to FIG. 6E, the patterns formed by the mask 38 are transferred to the underlying layers 36, 32. More specifically, the spin-on oxide layer 36 and the amorphous silicon layer 32 not covered by the mask 38 are removed. This removal process may be accomplished via reactive ion etching, ion milling, or the like. In this embodiment, a thin layer of the amorphous silicon layer 32 not covered by the mask 38 remains after the removal process. It is to be understood that this thin layer may also be removed. The removal of the non-masked portions of layers 32, 36 forms the transferable feature(s) 16 and the non-transferable feature(s) 18, both of which are substantially covered by the spin-on oxide layer 36 and the mask 38.

Figure 6F:
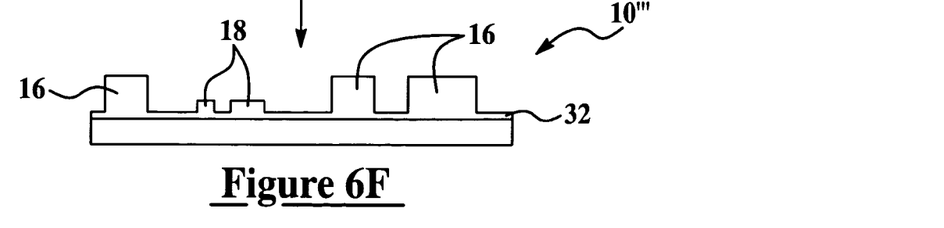

FIG. 6F depicts removing the mask 38 and the remaining spin-on oxide layer 36 from the transferable feature(s) 16 and the non-transferable feature(s) 18. Removal of the layer 36 and the mask 38 may be accomplished via HF etching processes. This exposes the respective features 16, 18.

Although in the various Figures, a plurality of transferable features 16 and substantially non-transferable features 18 have been shown, it is to be understood that a single transferable feature 16 and a single substantially non-transferable feature 18 on a single substrate is contemplated as being within the purview of the present disclosure.

In the embodiments disclosed herein, it is to be understood that the materials that form the transferable feature(s) 16 and the substantially non-transferable feature(s) 18 may be established, deposited, patterned, and/or removed so that any desirable pattern of the features 16, 18 is formed on the substrate 14. Furthermore, the area of the substrate 14 upon which the non-transferable features 18 are formed may be predetermined so that the features 18 are in a position to advantageously assist with aligning the mold 10 with an object/material to be molded.

Very generally, a method of using embodiments of the nanoimprint mold 10, 10', 10'', 10''' disclosed herein includes aligning the substantially non-transferable feature(s) 18 with an area of a material. It is to be understood that the area is selected so that a pattern desirably will not be substantially transferred thereto. The nanoimprint mold 10, 10', 10'', 10''' is then pressed into the material, whereby a negative replica of the transferable feature(s) 16 is transferred to the material. It is to be understood that the pattern of the non-transferable feature(s) 18 does not substantially transfer to the material, or it imprints the material so slightly that substantially no appreciable difference in the surface of the material is made.

One of many advantages of the nanoimprint mold 10 of the present disclosure having a substantially non-transferable feature(s) 18 and a transferable feature(s) 16 is that substantially non-transferable feature(s) 18 generally do not mark the material (described immediately above) into which the mold is imprinted, or the mark(s) made by feature(s) 18 are so shallow that they are substantially invisible and/or easily removable before a subsequent mold 10 with the same substantially non-transferable feature(s) 18 alignment mark(s) is in place for subsequent imprinting. This advantageously enables (1) virtually zero offset alignment, where the subsequent alignment shallow marks can compare to the first mark recorded at the same location; and (2) valuable real estate savings on the material to be imprinted by not making multiple imprints of the alignment marks from different imprints of mold 10. Some suitable methods for achieving such alignment and imprintable material real estate savings are described in co-pending, related U.S. application Ser. No. 11/496,368, filed on Jul. 31, 2006.

While several embodiments of the invention have been described in detail, it will be apparent to those skilled in the art that the disclosed embodiments may be modified. Therefore, the foregoing description is to be considered exemplary rather than limiting.

What is claimed is:

1. A nanoimprint mold, comprising:
    a substrate;
    at least one substantially non-transferable feature defined on a portion of the substrate; and
    at least one transferable feature defined on an other portion of the substrate, wherein the at least one transferable feature is formed of at least one of silicon, silicon dioxide, silicon nitride, α-silicon, silicon carbide, metals, diamond, $CaF_2$, or combinations thereof; and wherein the at least one substantially non-transferable feature is formed of at least one of chromium, silicon nitride, silicon, platinum, gold, aluminum, tungsten, or combinations thereof;
wherein both the at least one substantially non-transferable feature and the at least one transferable feature are permanent, imprintable structural components of the nanoimprint mold;
and wherein the at least one transferable feature has a height ranging from about 20 nm to about 1000 nm, and wherein a height of the at least one substantially non-transferable feature is less than about 20% of the height of the at least one transferable feature.

2. The nanoimprint mold as defined in claim 1 wherein the at least one transferable feature further includes a layer selected from silicon nitride, chromium, and combinations thereof.

3. A method of using the nanoimprint mold of claim 1, comprising:
aligning the at least one substantially non-transferable feature with an area of a material substantially not having a pattern transferred thereto; and
pressing the nanoimprint mold into the material, thereby transferring a negative replica of the at least one transferable feature to the material.

4. A method of forming the nanoimprint mold of claim 1, comprising:
simultaneously forming a desired pattern for the at least one non-transferable feature and a desired pattern for the at least one transferable feature;
forming the at least one substantially non-transferable feature on the portion of the substrate; and
forming the at least one transferable feature on the other portion of the substrate.

5. The method as defined in claim 4 wherein the substantially non-transferable feature has a predetermined height that is less than about 20% of a height of the at least one transferable feature, and wherein the height of the at least one transferable feature ranges from about 20 nm to about 1000 nm.

6. The method as defined in claim 4 wherein forming the patterns, the at least one substantially non-transferable feature, and the at least one transferable feature are accomplished by:
establishing a material on at least two different portions of the substrate, thereby forming the patterns and the at least one transferable feature;
establishing a sacrificial layer so that the material at one of the at least two different portions, and portions of the substrate adjacent to the material at the one of the at least two different portions thereto remain exposed;
depositing a layer on at least the exposed portions of the substrate, thereby forming the at least one substantially non-transferable feature;
removing the material at the one of the at least two different portions; and
removing the sacrificial layer, thereby exposing the at least one transferable feature.

7. The method as defined in claim 6 wherein establishing the material is accomplished by electron beam lithography, reactive ion etching, nanoimprint lithography, x-ray lithography, photolithography, ion milling, liftoff, focused ion beam, or combinations thereof.

8. The method as defined in claim 6 wherein the layer is established at a predetermined height that is less than about 20% of a height of the material, and wherein the material height ranges from about 20 nm to about 1000 nm.

9. The method as defined in claim 4 wherein forming the patterns, the at least one substantially non-transferable feature, and the at least one transferable feature are accomplished by:
establishing a material on at least two different portions of the substrate, thereby forming the patterns and the at least one transferable feature;
establishing a sacrificial layer on the material at one of the at least two different portions and on portions of the substrate adjacent to the material at the one of the at least two different portions;
depositing a first layer on the sacrificial layer, the material, and exposed portions of the substrate;
removing the sacrificial layer, thereby exposing the material at the one of the at least two different portions and portions of the substrate adjacent to the material at the one of the at least two different portions;
depositing a second layer on the exposed adjacent portions of the substrate, thereby forming the at least one substantially non-transferable feature;
removing the material at the one of the at least two different portions; and
removing the first layer, thereby exposing the at least one transferable feature.

10. The method as defined in claim 9 wherein the second layer is established at a predetermined height that is less than about 20% of a height of the material, and wherein the material height ranges from about 20 nm to about 1000 nm.

11. The method as defined in claim 9 wherein establishing the sacrificial layer is accomplished by photolithography or electron-beam lithography.

12. The method as defined in claim 4 wherein forming the patterns, the at least one substantially non-transferable feature, and the at least one transferable feature are accomplished by:
establishing a material on a portion of the substrate;
establishing a layer on at least a portion of the material and on at least one exposed portion of the substrate, thereby forming the patterns and the at least one substantially non-transferable feature; and
removing a portion of the material such that the material having the layer thereon remains, thereby forming the at least one transferable feature.

13. The method as defined in claim 12 wherein the layer established on at least one exposed portion of the substrate is established at a predetermined height that is less than about 20% of a height of the material having the layer thereon, and wherein the height of the material having the layer thereon ranges from about 20 nm to about 1000 nm.

14. The method as defined in claim 12 wherein establishing the layer is accomplished by lithography and lift-off processes, or lithography and etching processes.

15. The method as defined in claim 4 wherein forming the patterns, the at least one substantially non-transferable feature, and the at least one transferable feature are accomplished by:
establishing at least two different layers on the substrate;
removing a portion of the at least two different layers, thereby forming the patterns including at least two stacks on the substrate, wherein one of the at least two stacks forms the at least one transferable feature;
establishing a sacrificial layer on the one of the at least two stacks that forms the at least one transferable feature;
removing one of the at least two different layers from an other of the at least two stacks, thereby forming the at least one substantially non-transferable feature; and
removing the sacrificial layer.

16. The method as defined in claim 15 wherein removing one of the at least two different layers is accomplished by selective etching, and wherein removing the portion of the at least two different layers is accomplished by lithography and etching.

17. The method of claim 15 wherein the at least one transferable feature has a height ranging from about 20 nm to about 1000 nm, and wherein a height of the at least one substantially non-transferable feature is less than about 20% of the height of the at least one transferable feature.

18. The method as defined in claim 4 wherein forming the patterns, the at least one substantially non-transferable feature, and the at least one transferable feature are accomplished by:

patterning a well in an amorphous silicon layer established on the substrate so that at least a portion of the amorphous silicon layer has a height suitable for the at least one transferable feature, and an other portion has a height suitable for the at least one non-transferable feature;

establishing a spin-on oxide layer in the well and on the amorphous silicon layer;

establishing a mask on the spin-on-oxide layer, thereby forming the patterns;

removing the spin-on oxide layer and at least portions of the amorphous silicon layer not covered by the mask, thereby forming the at least one transferable feature and the at least one non-transferable feature; and     removing the mask and the remaining spin-on oxide layer, thereby exposing the at least one transferable feature and the at least one non-transferable feature.

* * * * *

UNITED STATES PATENT AND TRADEMARK OFFICE
CERTIFICATE OF CORRECTION

PATENT NO. : 7,780,431 B2
APPLICATION NO. : 11/521235
DATED : August 24, 2010
INVENTOR(S) : Zhaoning Yu et al.

Page 1 of 1

It is certified that error appears in the above-identified patent and that said Letters Patent is hereby corrected as shown below:

In the Specifications:

In column 1, line 3, after the Title "NANOIMPRINT MOLDS AND METHODS OF FORMING THE SAME" insert -- Government License Rights - This invention was made with government support under contract no. HR0011-05-3-0001 awarded by the United States Defense Advanced Research Projects Agency. The government has certain rights in the invention. --

Signed and Sealed this
Twenty-third Day of July, 2013

Teresa Stanek Rea
*Acting Director of the United States Patent and Trademark Office*